[11] 3,553,486

United States Patent

[72] Inventor Bruce R. Dow
Murrysville, Pa.
[21] Appl. No. 710,853
[22] Filed Mar. 6, 1968
[45] Patented Jan. 5, 1971
[73] Assignee Westinghouse Electric Corporation
Pittsburgh, Pa.
a corporation of Pennsylvania

[54] HIGH NOISE IMMUNITY SYSTEM FOR INTEGRATED CIRCUITS

8 Claims, 2 Drawing Figs.

[52] U.S. Cl. ..... 307/213, 307/215, 307/218, 307/237
[51] Int. Cl. ..... H03k 17/00
[50] Field of Search ..... 307/202, 237, 215, 296, 218, 253, 255, 214, 213

[56] References Cited

UNITED STATES PATENTS 3,358,154 12/1967 Hung ..... 307/215
3,445,680 5/1969 Foster et al. ..... 307/218X

*Primary Examiner*—Donald D. Forrer
*Assistant Examiner*—B. P. Davis
*Attorneys*—F. H. Henson, R. G. Brodahl and E. F. Possessky

ABSTRACT: An input logic circuit for integrated circuits, particularly integrated circuits utilized in digital or pulse systems, prevents spurious signals (i.e., noise) from causing false triggering of the integrated circuit components.

PATENTED JAN 5 1971

3,553,486

WITNESSES:

Bernard R. Gieguay

James F. Young

INVENTOR

Bruce R. Dow

BY E. F. Possessky

ATTORNEY

HIGH NOISE IMMUNITY SYSTEM FOR INTEGRATED CIRCUITS

BACKGROUND OF THE INVENTION

As is known, integrated circuits are those in which many circuit components, particularly transistors and diodes, are formed by diffusion techniques into the top of a tiny block of silicon, the block itself serving as a point of common potential for all components. The individual component parts of the circuit cannot be separated from each other; and interconnections between the component parts within a given block of silicon are made by suitable means such as metallization patterns.

Such integrated circuits operate at very low voltage levels. In cases where they are used in pulse or digital systems, this creates a serious problem, particularly in industrial applications. The radiated energy prevalent in industrial locations can readily induce spurious voltages (i.e., noise) having magnitudes greater than the normal low voltage operating levels of the integrated circuit components, thereby giving rise to false triggering of multivibrators and the like.

In the past, various systems have been proposed to overcome the problem of noise in digital applications for integrated circuits; however these prior art techniques raise the cost and complexity and reduce the reliability of integrated circuits for industrial applications. The prevalent technique for small integrated circuit industrial systems is the use of shielding and separate filters for each input and output line from the circuitry to the controlled process. This requires that the circuitry itself be limited to an environment similar to that of a computer application and, as mentioned above, is complex, expensive and compromises reliability.

Another technique heretofore utilized to overcome the problem of noise in industrial applications for integrated circuits utilizes logic systems with higher signal levels in order to reduce the required shielding and filtering. Such systems, however, have not found wide acceptance since, among other reasons, they have typical propagation times of about 50 nanoseconds and thus may be susceptible to noise pulses of very short duration if the threshold voltage is exceeded.

SUMMARY OF THE INVENTION

As an overall object, the present invention seeks to provide circuitry for preventing electrical signals, other than those having a predetermined amplitude, from actuating electrical utilization apparatus, particularly pulse actuated apparatus.

Another object of the invention is to provide a high noise immunity system for integrated circuits which operate at low signal levels.

A further object of the invention is to provide a high noise immunity system for integrated circuits capable of being easily duplicated without requiring close tolerance control.

In accordance with the invention, input pulses are applied to integrated circuit apparatus through a diode whose threshold voltage is determined by the current flowing between the emitter and collector of one of two matched transistors which have their bases interconnected. The other of the two matched transistors has its emitter and collector connected to the opposite terminals of a source of driving potential, one of these terminals also being connected to the interconnected bases. With this configuration, and since the transistors are matched, their collector currents will be matched also. The choice of impedance elements in series with the respective collectors will, therefore, determine the value of the threshold voltage of the diode with great accuracy, thereby establishing the threshold level below which spurious signals such as noise cannot actuate the integrated circuit apparatus.

The above and other objects and features of the invention will become apparent from the following detailed description taken in connection with the accompanying drawings which form a part of this specification.

DESCRIPTION OF THE PREFERRED EMBODIMENT

Figure 1:
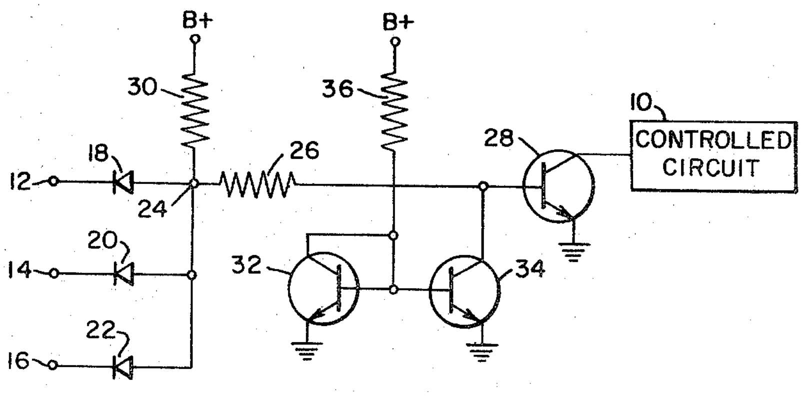
FIG. 1 is a schematic circuit diagram of one embodiment of the invention.

With reference now to FIG. 1, the integrated circuit to be controlled is identified by the block 10. Input pulses to the controlled circuit 10 may be applied to any one of a plurality of input terminals 12, 14 or 16. Each input terminal, in turn, is connected to the cathode of an associated diode 18, 20 or 22, the anodes of the diodes 18—22 being connected to a common point 24.

The point 24 is connected through resistor 26 to the base of an NPN transistor 28 having its emitter connected to ground and its collector connected to the controlled circuit 10. It will be assumed that the transistor 28 is normally conducting and that the input pulses applied to terminals 12—16 are negative with respect to ground. Thus, assuming that the pulses applied to terminals 12—16 overcome the threshold voltage of the diodes 18—22 established at point 24, the diodes will conduct to apply a negative pulse to the base of transistor 28, thereby cutting it off and applying an input pulse to the controlled circuit 10.

The point 24 is connected to the positive terminal of a source of driving potential (identified as B+) through resistor 30, the negative terminal of this source of driving potential being grounded. The circuit also includes a pair of NPN transistors 32 and 34 having their bases interconnected. The two interconnected bases being connected to the positive terminal of the B+ voltage source through resistor 36. The emitters of transistors 32 and 34 are connected directly to ground; while the collector of transistor 32 is connected to the interconnected bases. The collector of transistor 34, on the other hand, is connected to the base of transistor 28. Transistor 34 acts as a current source and normally conducts in the absence of pulses applied to terminals 12—16; however it is not saturated during this time and its collector-emitter voltage drop biases transistor 28 into conduction with the collector of transistor 34 being positive with respect to its emitter. While the circuit has been described as if the resistors and the components 18—22, 32, 34 and 28 were discrete elements, actually they can be and preferably are all formed on a single silicon wafer in accordance with integrated circuit technology.

In this respect, the transistors 32 and 34 are similar, and assuming that they are fabricated adjacent to each other on a single silicon wafer, are fairly well matched. Since both have reasonable common emitter current gain, the current from resistor 36 is conducted principally by the collector of transistor 32. Since transistors 32 and 34 are matched, and since they have identical base-emitter voltages, the collector current of transistor 34 is equal to that of transistor 32 or:

$$\text{Collector Current, transistor 34} = \frac{V_{B+} - V_{BE}}{R_{36}}$$

where:

$V_{B+}$ = supply voltage $V_{BE}$ = base emitter voltage of transistor 32, and $R_{36}$ = resistance of resistor 36

This causes the threshold voltage for the circuit appearing at point 24 to be nearly equal to the collector current of transistor 34 times the resistance of resistor 26 or:

$$\frac{V_{B+} - V_{BE}}{R_{36}} \times R_{26}$$

where: $R_{26}$ is the resistance of resistor 26

This is true since the diode drops and the base-emitter voltage of transistor 28 are nearly equal. Thus, the threshold voltage for the circuit is determined by the power supply voltage and the ratio of the resistance of resistor 26 to resistor 36. As the ratios of the resistors can be held very well in silicon monolithic circuits, this insures a reasonable yield of in-tolerance devices. The dependence on power supply may also be used to advantage, permitting versatile application. The output stage comprising transistor 28 is not optimum, as noise immunity is much improved by a collector resistor; however the embodiment shown is sufficient for purposes of the present description.

Figure 2:
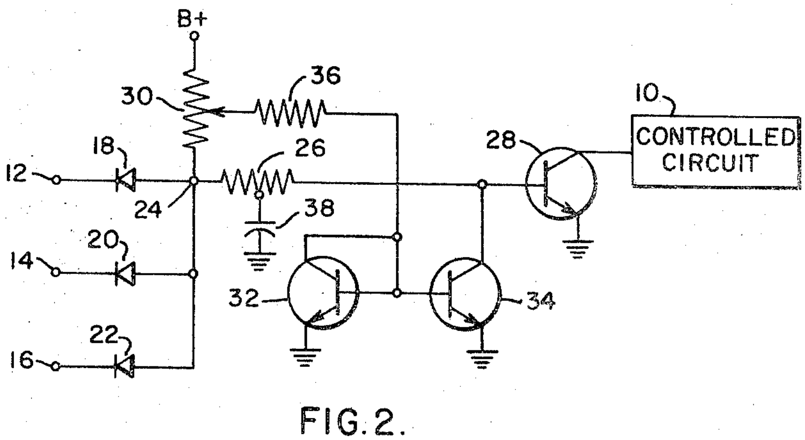
FIG. 2 is a schematic circuit illustration of another embodiment of the invention.

A modification of the circuit of FIG. 1 is illustrated in FIG. 2 wherein elements corresponding to those of FIG. 1 are identified by like reference numerals. The circuit of FIG. 2 provides a method for filtering input signals, thus increasing the propagation time deliberately Attempts to do this with conventional integrated circuits by means of a single external capacitor encounter one or more of several problems. That is, rise and fall times are greatly dissimilar; pulse stretching occurs for some types of noise; the circuit is destroyed; or slow switching times with short delay times are encountered, complicating the design of flip-flops and other integrated circuit components. In order to overcome these difficulties, a tap on resistor 26 is connected to ground through capacitor 38, and resistor 36 is returned to a tap on resistor 30 rather than directly to the B+ voltage supply. This combination will permit nearly symmetrical on and off switching times. In this case, at least the resistors 26 and 30 are preferably embodied as separate circuit components in order to provide conveniently for movement of the taps associated therewith.

The present invention thus provides a means for permitting spurious signals from causing false triggering of pulse-actuated integrated circuits and the like by establishing an easily-duplicated threshold voltage level below which input pulses will not be applied to the integrated circuit. Although the invention has been shown in connection with certain specific embodiments, it will be readily apparent to those skilled in the art that various changes in form and arrangement of parts may be made to suit requirements without departing from the spirit and scope of the invention. In this respect, for example, it will be appreciated that the circuit can employ PNP transistors rather than the NPN type shown herein.

I claim:

1. For use with electrical apparatus adapted to be actuated by electrical pulses applied to an input terminal; the combination of circuitry for preventing signals other than those having a predetermined amplitude from actuating said electrical apparatus, comprising a pair of terminals adapted for connection to a source of driving potential, a pair of transistors each having base, emitter and collector electrodes, means interconnecting the base electrodes of said transistors, means electrically connecting one of the two remaining electrodes of each transistor to one of said driving potential terminals, means including an impedance element connecting said interconnected bases to the other driving potential terminal, means short circuiting the base and the other of the two remaining electrodes of one of said transistors, a pair of impedance elements connecting the other of the two remaining electrodes of the other transistor to said other driving potential terminal, at least one diode for connecting said input terminal to the junction of said last-mentioned impedance elements, and means for connecting said other of the two remaining electrodes of said other transistor to the input of said electrical apparatus.

2. The combination of claim 1 wherein said one of the two remaining electrodes of each transistor comprises the emitter of each transistor and the other of the two remaining electrodes of each transistor comprises its collector electrode.

3. The combination of claim 1 wherein said impedance elements comprise resistors.

4. The combination of claim 1 wherein said transistors comprise NPN transistors, said input terminal is connected to the cathode of said diode, and the anode of said diode is connected to the junction of said last-mentioned impedance elements.

5. The combination of claim 1 including a capacitor connecting one of said two last-mentioned impedance elements to one of said driving potential terminals.

6. The combination of claim 1 wherein at least said transistors and said diode are formed on a single silicon wafer.

7. The combination of claim 1 including a plurality of diodes each having its anode connected to the junction of said last-mentioned impedance elements.

8. The combination of claim 1 wherein the means connecting said interconnected bases to the other driving potential terminal includes a first resistor having one end connected to said interconnected bases and its other end connected to a movable tap on a variable resistor, said variable resistor being one of said last-mentioned impedance elements.